United States Patent
Raghava et al.

(10) Patent No.: US 12,237,831 B2
(45) Date of Patent: Feb. 25, 2025

(54) NETWORK-ON-CHIP (NOC) WITH FLEXIBLE DATA WIDTH

(71) Applicant: Intel Corporation, Santa Clara, CA (US)

(72) Inventors: Sharath Raghava, Los Gatos, CA (US); Ankireddy Nalamalpu, Portland, OR (US); Dheeraj Subbareddy, Portland, OR (US); Harsha Gupta, Sunnyvale, CA (US); James Ball, San Jose, CA (US); Kavitha Prasad, San Jose, CA (US); Sean R. Atsatt, Santa Cruz, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/198,122

(22) Filed: May 16, 2023

(65) Prior Publication Data

US 2023/0370068 A1   Nov. 16, 2023

Related U.S. Application Data

(63) Continuation of application No. 17/556,917, filed on Dec. 20, 2021, now Pat. No. 11,700,002, which is a continuation of application No. 17/033,524, filed on Sep. 25, 2020, now Pat. No. 11,342,918, which is a continuation of application No. 16/234,212, filed on Dec. 27, 2018, now Pat. No. 10,790,827.

(51) Int. Cl.
*H03K 19/177* (2020.01)
*H03K 19/17736* (2020.01)
*H03K 19/17796* (2020.01)
*H04L 41/5019* (2022.01)
*H04L 41/5003* (2022.01)

(52) U.S. Cl.
CPC .. *H03K 19/17736* (2013.01); *H03K 19/17796* (2013.01); *H04L 41/5019* (2013.01); *H04L 41/5003* (2013.01)

(58) Field of Classification Search
CPC ........ H03K 19/17736; H03K 19/17796; H04L 41/5003; H04L 41/5019
See application file for complete search history.

(56) References Cited

U.S. PATENT DOCUMENTS

| | | |
|---|---|---|
| 7,106,760 B1 | 9/2006 | Perumal et al. |
| 8,411,696 B1 | 4/2013 | Ko et al. |
| 8,464,088 B1 | 6/2013 | Nguyen et al. |
| 8,693,314 B1 | 4/2014 | Horton et al. |

(Continued)

OTHER PUBLICATIONS

Burd, Thomas, et al.; "Zeppelin': An SoC for Multichip Architectures," IEEE Journal of Solid State Circuits, vol. 54, No. Oct. 26, 2018, 11 pgs. (Year: 2018).*

(Continued)

*Primary Examiner* — Kurtis R Bahr
(74) *Attorney, Agent, or Firm* — Fletcher Yoder, P.C.

(57) ABSTRACT

Techniques described herein may relate to providing a programmable interconnect network (e.g., a programmable network-on-chip (NOC)). A method may include determining a transmission parameter, bonding one or more channels of an interconnect network based at least in part on the transmission parameter, and power-gating any unused channels after the bonding.

16 Claims, 9 Drawing Sheets

(56) References Cited

U.S. PATENT DOCUMENTS

| | | | | |
|---|---|---|---|---|
| 9,105,316 B2* | 8/2015 | Jones | ............... | H01L 25/0655 |
| 9,432,298 B1* | 8/2016 | Smith | ............... | H04L 49/9057 |
| 10,503,690 B2* | 12/2019 | Swarbrick | ............ | H04L 41/0813 |
| 2006/0104315 A1 | 5/2006 | Volkening et al. | | |
| 2006/0182139 A1 | 8/2006 | Bugajski et al. | | |
| 2007/0140286 A1 | 6/2007 | Kraus | | |
| 2010/0080561 A1 | 4/2010 | Paranjape et al. | | |
| 2011/0135046 A1* | 6/2011 | Jones | ................ | H04L 49/109 |
| | | | | 375/354 |
| 2012/0027026 A1 | 2/2012 | Duwel et al. | | |
| 2012/0128045 A1 | 5/2012 | Ling et al. | | |
| 2013/0010585 A1 | 1/2013 | Chu et al. | | |
| 2013/0235739 A1 | 9/2013 | Mamidwar et al. | | |
| 2017/0170153 A1* | 6/2017 | Khare | ............... | H01L 23/5386 |
| 2019/0103872 A1* | 4/2019 | Clark | ............... | H03K 19/1776 |
| 2019/0363717 A1* | 11/2019 | Swarbrick | ............. | G06F 21/85 |

OTHER PUBLICATIONS

Beck, Noah, et al.; "Zeppelin': An SoC for Multichip Architectures," 2018 IEEE International Solid State Circuits Conference, Digest of Technical Papers, Feb. 12, 2018, pp. 40-42.

Burd, Thomas, et al.; "Zepplin': An SoC for Multichip Architectures," IEEE Journal of Solid State Circuits, vol. 54, No. Oct. 26, 2018, 11 pgs.

* cited by examiner

NETWORK-ON-CHIP (NOC) WITH FLEXIBLE DATA WIDTH

CROSS-REFERENCE TO RELATED APPLICATIONS

This application is a continuation of U.S. application Ser. No. 17/556,917, filed on Dec. 20, 2021, entitled "Network-on-Chip (NOC) with Flexible Data Width," which is a continuation of U.S. application Ser. No. 17/033,524, filed on Sep. 25, 2020, entitled "Network-on-Chip (NOC) with Flexible Data Width," now U.S. Pat. No. 11,342,918, which is a continuation of U.S. application Ser. No. 16/234,212, filed Dec. 27, 2018, entitled "Network-on-Chip (NOC) with Flexible Data Width," now U.S. Pat. No. 10,790,827, which is hereby incorporated by reference in its entirety for all purposes.

BACKGROUND

The present disclosure relates generally to network-on-chip (NOC) circuits for integrated circuit devices and, more particularly, to a network-on-chip (NOC) that can flexibly support different data widths.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Advances in microelectronics have enabled the continued increase in transistor densities for a variety of integrated circuit devices. Indeed, some advanced integrated circuits, such as field programmable gate arrays (FPGAs) or other programmable logic devices, may include large number of transistors that enable an increasingly wide variety of programmable circuit designs that can implement a large number of different functions. In some programmable logic devices, data may be packetized and routed to or from these different functions using data-transfer protocols over a fixed interconnect network circuit known as a network-on-chip (NOC). Because a circuit design for a programmable logic device may not be known in advance, however, the network-on-chip (NOC) may be designed based on likely use cases of a circuit design in the future. Thus, if the network-on-chip (NOC) does not have a wide enough bandwidth for certain wide-band protocols, for example, the network-on-chip (NOC) may be unable to accommodate those protocols. Likewise, when a circuit design uses a protocol with a bandwidth that is smaller than the bandwidth of the network-on-chip (NOC), the network-on-chip (NOC) may be underutilized. This underutilization may cause inefficiencies in the FPGA design and lead to higher power consumption.

BRIEF DESCRIPTION OF THE DRAWINGS

Advantages of the present disclosure may become apparent upon reading the following detailed description and upon reference to the drawings in which.

DETAILED DESCRIPTION OF SPECIFIC EMBODIMENTS

Figure 1:
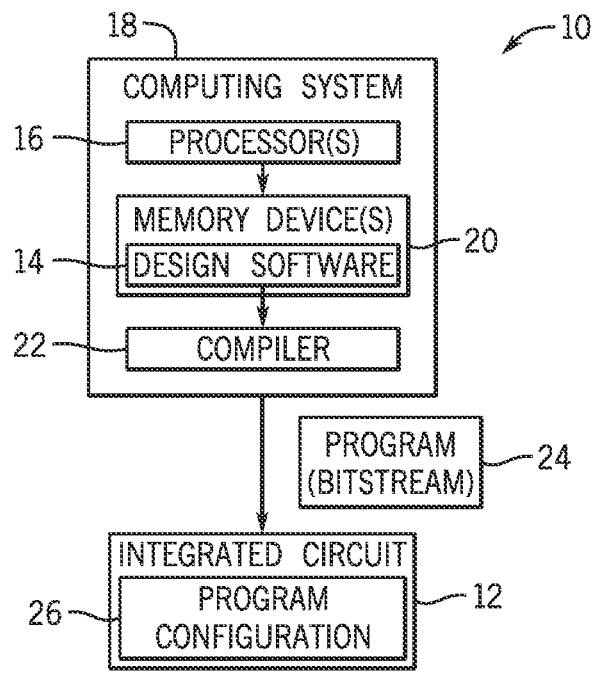
FIG. 1 is a block diagram of a computing system that may be used to program an integrated circuit system having a programmable interconnect network, in accordance with an embodiment.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Programmable logic devices such as field programmable gate arrays (FPGAs) are advanced integrated circuits that have proven their value for processing operations and, as a result, many new use cases for programmable logic devices have evolved and emerged. Data may be routed to or from different areas of a programmable logic device using a fixed interconnect network circuit known as a network-on-chip (NOC). However, programmable logic devices, as well as other integrated circuits, may underutilize fixed interconnect networks.

A programmable interconnect network (e.g., a programmable network-on-chip (NOC)) with flexible data paths may support a variety of possible bandwidths, leading to more efficient utilization and scalability and may permit manufacturers of integrated circuits to meet quality of service (QoS) metrics and/or design parameters (e.g., where a customer may specify a desired bandwidth or transmission characteristic). For example, if an interconnect uses a fixed data path width of 64 bytes (64B), and the fixed data path width transmits a payload with a width of 16 bytes (16B), then the interconnect is considered underutilized and power and/or resources may be wasted. In contrast, a programmable interconnect network that has a programmable data path width may be programmed to allocate a higher or lower data path width based on an application of the integrated circuit.

The programmable interconnect network may include one or more data paths (also referred to as data channels and/or address channels based on the type of data the data path transmits) and may transmit data between one or more circuit elements of the integrated circuit via the data paths. For example, the one or more data paths may transmit data between one or more application functional units programmed into a programmable logic fabric via the data paths. An application functional unit may encapsulate a transaction into a data packet (e.g., a command packet) and may send the data packet to an additional application functional unit or other component using a transport layer of the programmable interconnect network and bridge circuitry. In this way, the bridge circuitry may be within or on a boundary between the application functional unit that generates data and the programmable interconnect network. It is noted that in circuits, such as application-specific integrated circuits (ASIC) or other programmable circuits other than programmable logic devices, an application functional unit may be circuitry that generates data to be transmitted to other circuitry via the programmable interconnect network.

Routers of the programmable interconnect network may be logically bonded together based on transmission parameters associated with the data to be transmitted between the application functional units (e.g., based on expected transmission patterns). The logical bonding may be done at a time of configuration for the programmable interconnect network based on transmission parameters. Individual routers may be programmed during a configuration time to have master or slave configurations. Routers then work together (e.g., one master with one or more slaves) to transmit a received data packet following a lockstep transmission format. Transmission parameters may include, for example, a direction of transmission, power and/or latency considerations, transmission bandwidth associated with the data to be transmitted, and/or a prioritization indication describing which respective transmission parameter is to be a priority, or the like. Transmission parameters may be derived by software during the circuit design process or may be included as indications in a file or as part of a circuit design to be optimized, placed, and/or routed. In this way, the transmission parameters may be based at least in part on a direction of transmission indication, a destination application functional unit indication, a destination location indication, power considerations, latency considerations, and/or a prioritization indication, or the like.

The routers, and associated data paths, are logically bonded together based at least in part on the transmission parameters defining transmission characteristics of data to be transmitted between routers (e.g., such as from one application functional unit to another application functional unit). Thus, more data channels may be bonded together to transmit data having a relatively larger bandwidth while a lower number of data paths to transmit data having a smaller bandwidth. These implementations described herein may be carried out in programmable logic devices (e.g., FPGAs), application-specific integrated circuits (ASICs), or any other suitable device (e.g., a suitable processor running instructions to carry out the programmable interconnect network implementations of this disclosure).

With the foregoing in mind, FIG. 1 illustrates a block diagram of a system 10 that may be used to program an integrated circuit 12. The integrated circuit 12 may be reconfigurable (e.g., FPGA) or may be an application-specific integrated circuit (ASIC). A user may implement a circuit design to be programmed onto the integrated circuit 12 using design software 14, such as a version of Quartus by Intel®.

The design software 14 may be executed by one or more processors 16 of a computing system 18. The computing system 18 may include any suitable device capable of executing the design software 14, such as a desktop computer, a laptop, a mobile electronic device, a server, or the like. The computing system 18 may access, configure, and/or communicate with the integrated circuit 12. The processor(s) 16 may include multiple microprocessors, one or more other integrated circuits (e.g., ASICs, FPGAs, reduced instruction set processors, and the like), or some combination of these.

One or more memory devices 20 may store the design software 14. In addition, the memory device(s) 20 may store information related to the integrated circuit 12, such as control software, configuration software, look up tables, configuration data, etc. In some embodiments, the processor(s) 16 and/or the memory device(s) 20 may be external to the computing system 18. The memory device(s) 20 may include a tangible, non-transitory, machine-readable-medium, such as a volatile memory (e.g., a random access memory (RAM)) and/or a nonvolatile memory (e.g., a read-only memory (ROM)). The memory device(s) 20 may store a variety of information that may be used for various purposes. For example, the memory device(s) 20 may store machine-readable and/or processor-executable instructions (e.g., firmware or software) for the processor(s) 16 to execute, such as instructions to determine a speed of the integrated circuit 12 or a region of the integrated circuit 12, determine a criticality of a path of a design programmed in the integrated circuit 12 or a region of the integrated circuit 12, programming the design in the integrated circuit 12 or a region of the integrated circuit 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design program 24 (bitstream), sometimes known as a program object file, which programs the integrated circuit 12. That is, the compiler 22 may provide machine-readable instructions representative of the circuit design to the integrated circuit 12. For example, the integrated circuit 12 may receive one or more programs 24 as bitstreams that describe the hardware implementations that should be stored in the integrated circuit 12. The programs 24 (bitstreams) may programmed into the integrated circuit 12 as a program configuration 26.

A controller may receive the programs 24 (bitstreams) and operate to configure the integrated circuit 12 according to the programs 24 (bitstreams). For example, as depicted in FIG. 2, the integrated circuit 12 may be a FPGA that may be reconfigured according to the programs 24 (bitstreams) to perform a wide range of tasks and/or functions.

Figure 2:
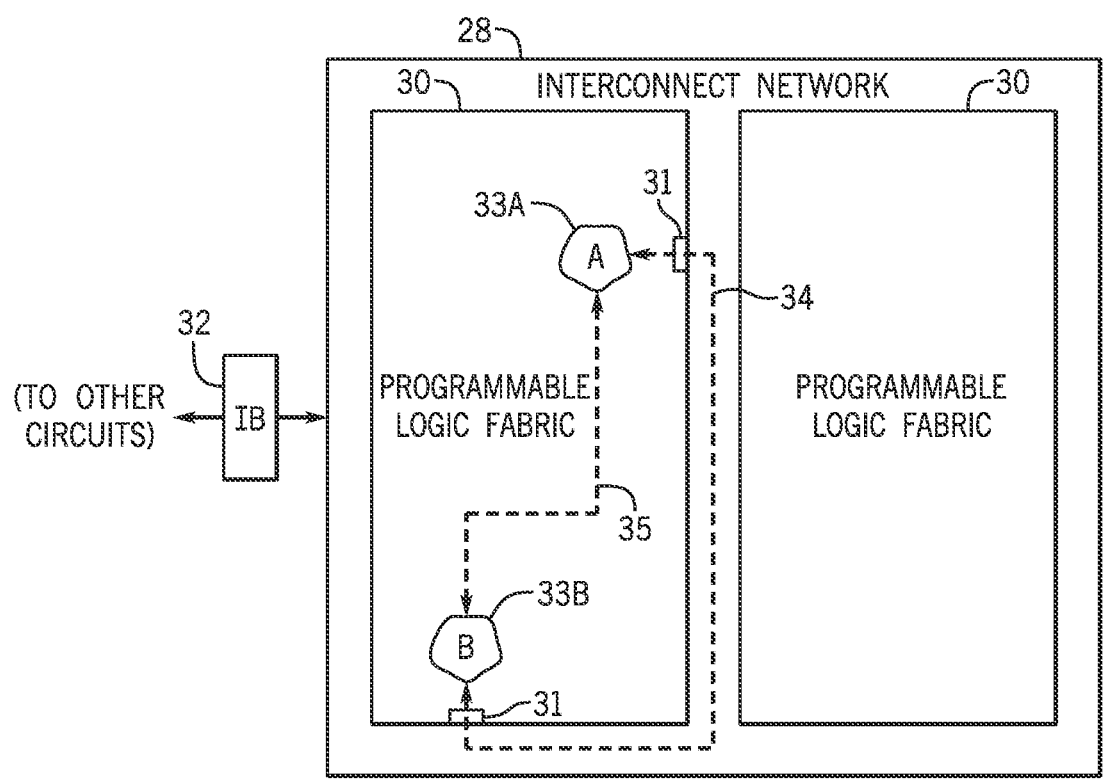
FIG. 2 is a block diagram of the integrated circuit of FIG. 1, in accordance with an embodiment.

FIG. 2 is a block diagram of the integrated circuit 12 of FIG. 1 and includes a programmable interconnect network 28 (e.g., network-on-chip (NOC)) and programmable logic fabric 30 that is programmable (and reprogrammable) based on the programs 24 (bitstreams). The programmable logic fabric 30 may include a number of programmable logic elements having operations defined by configuration memory (e.g., configuration random access memory (CRAM)). The programmable logic elements may include look-up tables, registers, multiplexers, routing wires, and so forth. A designer may program the programmable logic fabric 30 to perform a variety of desired functions. The programmable interconnect network 28 and the programmable logic fabric 30 may be programmed at a similar or same time. Portions or regions of the programmable logic fabric 30 may be programmed to perform different functions and/or replications of the same function. Sometimes, the programmable logic fabric 30 is programmed to interact with other circuitry via interconnect boundary circuitry 31 and an interconnect block 32. The other circuitry may include any combination of memory, transceiver, ASICs, and/or any suitable circuitry that may also be used in addition to programmable logic fabric 30 to perform processing or functional operations associated with the integrated circuit 12. The programmable interconnect network 28 may be used to facilitate memory transactions between multiple sectors, multiple dies, and/or between the integrated circuit 12 and external systems. The programmable interconnect network 28 may be further for decrypting configuration programs (bitstreams) 24 (e.g., configuration data), for locally sequencing reads and writes to implement error detection and correction on the memory, and/or for sequencing test control signals to effect various test modes.

As described above, the programmable logic fabric 30 may have two separately programmed portions, portion 33A and portion 33B. The portion 33A may perform a processing operation separate from the portion 33B. The processing operation of the portion 33A may be unique and therefore different from the processing operation of the portion 33B. In some cases, the portions 33 may transmit data between each other in order to complete the processing operation. For example, the portion 33A may identify a face in an image and the portion 33B may perform processing on the image excluding the face. In this way, it may be desirable to transmit data from the portion 33A to the portion 33B in order to complete the processing operation.

There may be two ways to do this. The first technique may be used to send the data from the portion 33A to the portion 33B via a data path 34 of the programmable interconnect network 28. The second technique may be used to send the data from the portion 33A to the portion 33B via a data path 35 of the programmable logic fabric 30. Using the data path 35 may be a slower, less efficient method of transmitting the data from the portion 33A to the portion 33B. In addition, the data path 35 may use precious programmable logic fabric 30 in the path, making it a higher cost option than the data path 34 of the programmable interconnect network 28. The portion 33A may transmit data to the data path 34 via the interconnect boundary circuitry 31. As will be appreciated, the interconnect boundary circuitry 31 may include a variety of circuitry to facilitate the packet-ing and/or transmission of the data between the portions 33. For example, the interconnect boundary circuitry 31 may couple to application functional units of the integrated circuit 12 and may use bridge circuitry to transition data between the portions 33 and the programmable interconnect network 28.

Figure 3:
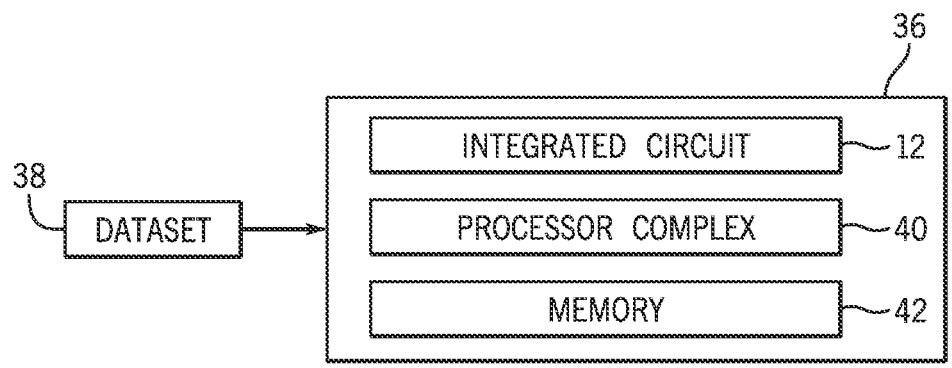
FIG. 3 is a block diagram of the integrated circuit system of FIG. 1 programmed by the computing system, in accordance with an embodiment.

As shown in FIG. 3, the integrated circuit 12 may operate in a data processing system 36 to assist in processing a dataset 38. The data processing system 36 may represent, for example, a computing device in a datacenter, which may process network traffic, image data, video data, financial data, or any other suitable form of data. In some examples, the dataset 38 may be processed using a machine-learning or neural-network algorithm that may employ the programmable interconnect network 28 of this disclosure to transmit and communication data from a first location to a second location within the integrated circuit 12 and/or data processing system 36. A processor complex 40 may execute instructions (e.g., software or firmware) stored in memory 42 to receive and route the dataset 38, as well as to control the integrated circuit 12. For instance, the processor complex 40 may run software to analyze process network traffic, image data, video data, financial data, or any other suitable form of data, offloading to the integrated circuit 12 operations that are well-suited to processing on the integrated circuit 12. The memory 42 may store the one or more programs 24 (bitstreams) that may be used to program a programmable logic fabric 30 of the integrated circuit 12 (e.g., when the integrated circuit 12 is a programmable logic device (PLD), such as a FPGA).

Figure 4:
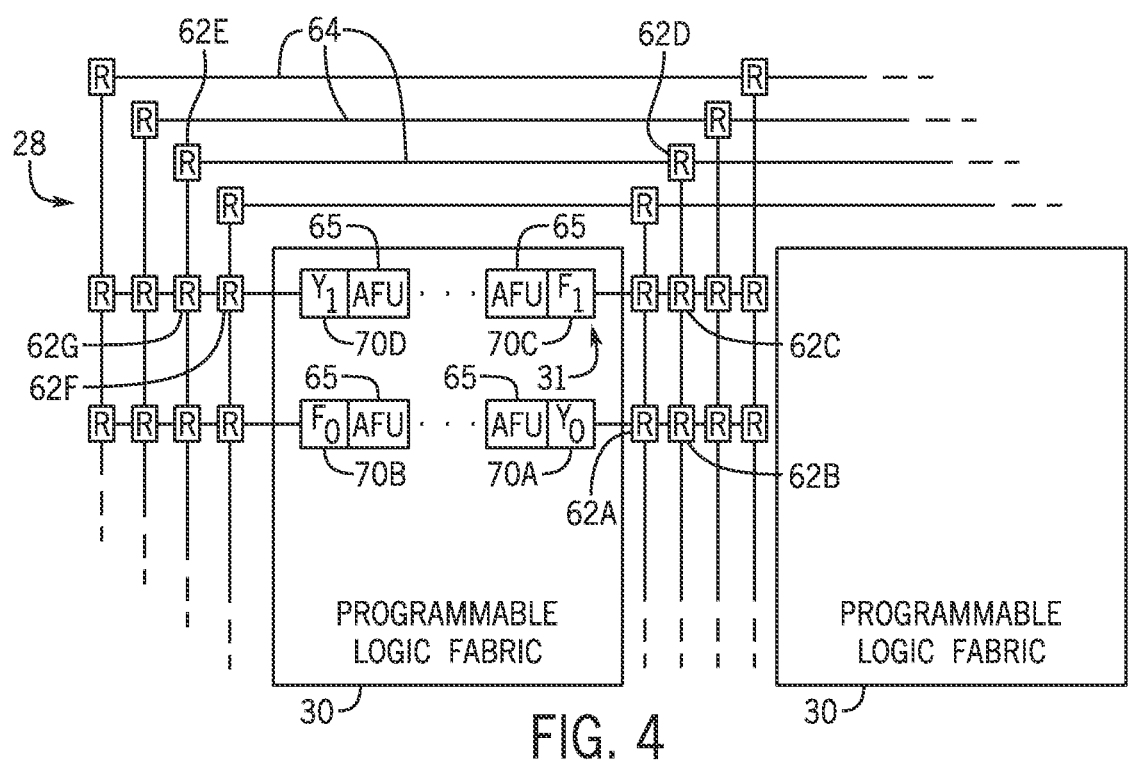
FIG. 4 is a block diagram of an example of the programmable logic fabric and the programmable interconnect network of FIG. 3 as used in a field programmable gate array (FPGA), in accordance with an embodiment.

FIG. 4 is a block diagram depicting the programmable interconnect network 28, one or more routers 62, one or more physical paths 64 (e.g., data channels), and interconnect boundary circuitry 31 each including one or more application functional units (AFUs) 65 and bridges 70. This depicted example shows the programmable interconnect network 28 as used in a programmable logic device. Each of the AFUs 65 represent a programmed function of the programmable logic device and thus have been configured through loading of the one or more programs 24 (bitstreams) into CRAM associated with logic blocks of the programmable logic fabric 30. Thus, the AFUs 65 may generate and/or receive any suitable packetized data from either external circuitry or from other AFUs 65 via the programmable interconnect network 28. In some embodiments, the programmable interconnect network 28 is disposed around a perimeter of the programmable logic fabric 30 of the integrated circuit 12. When the programmable interconnect network 28 is not integrated into the programmable logic fabric 30, the integrated circuit 12 may include circuitry to transfer packetized data from a first portion of the programmable logic fabric 30 to a second portion of the programmable logic via the physical paths 64. The integrated circuit 12 may include the bridge 70 to perform the transmission of data from the programmable logic fabric 30 to the programmable interconnect network 28.

To facilitate the transfer of data between the AFUs 65, the one or more routers 62 may transmit data between respective routers 62. For example, to transmit data from the bridge 70A to the bridge 70D, the router 62A may transmit data to the router 62B, which may then transmit the data to the router 62C. Transmission of the data through the other routers 62 may follow a path including the routers 62C, 62D, 62E, 62F, 62G.

In some embodiments, an example interconnect network may have a hardened transmission path which provides a set bandwidth. When the corresponding FPGA is programmed to have and use the interconnect network, the FPGA may use data which has a smaller bandwidth than the set bandwidth. When this data is transmitted through the interconnect network, the interconnect network is considered underutilized or over-provided (e.g., as an example of overprovision) since the bandwidth of the programmable interconnect network 28 is larger than a true bandwidth needed for a successful transmission. Overprovision of the bandwidth of the programmable interconnect network 28 may cause the transmission of data to be less efficient at least in terms of power consumption and utilization since more physical paths of the hardened transmission path are powered on than is sufficient for the transmission.

To correct for this, a programmable interconnect network 28 may be programmed at a time of configuration of the programmable logic fabric 30 to have an application-dependent bandwidth. In this way, the routers 62 may be configured to logically bond subsets of the physical paths 64 together to form larger paths. Thus, larger bandwidth paths may be formed from the physical paths 64 that individually have smaller bandwidths. The physical paths 64 may be bonded based on the particular data usage expectations for the particular design loaded onto the integrated circuit 12 (e.g., stored in configuration memory, such as CRAM). For example, at a time of configuration (e.g., programming) of the programmable logic fabric 30 (e.g., at a time of device configuration), it may be determined (such as by the compiler 22 or computing system 18) that a suitable bandwidth for the programmable interconnect network is for one path to be 16 bytes and another path to be 32 bytes. Thus, in response to this determination, the programmable interconnect network 28 may be programmed to have one physical path having a bandwidth of 16 bytes and another having a bandwidth of 32 bytes, instead of the whole programmable interconnect network 28 being programmed to have a bandwidth of 32 bytes.

Figure 5A:
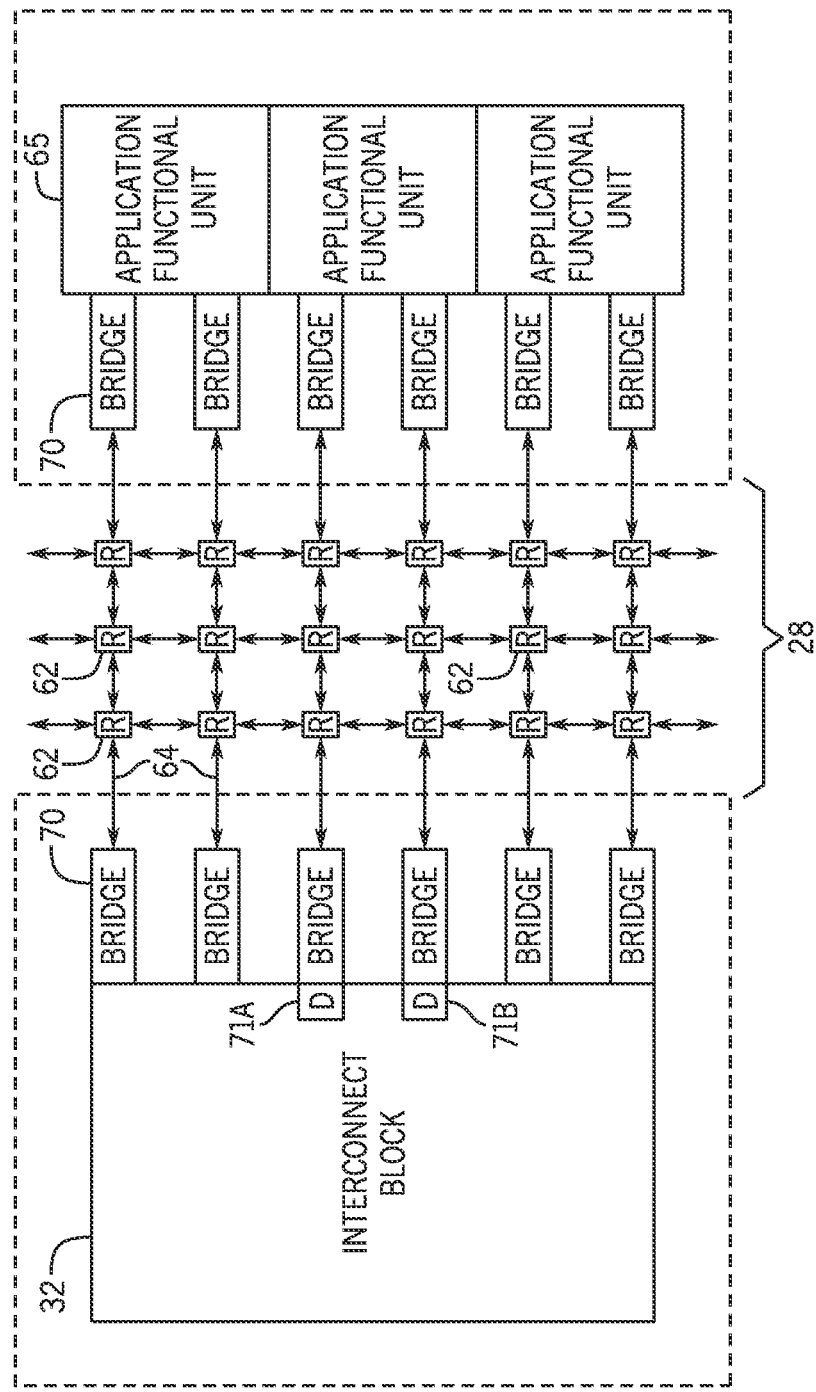
FIG. 5A is a block diagram of a generalized example of the programmable interconnect network of FIG. 3, in accordance with an embodiment.

While FIG. 4 depicts a specific use-case of the programmable interconnect network 28, FIG. 5A is a block diagram of a generalized example of the programmable interconnect network 28. Thus, the depicted programmable interconnect network 28 may be used in a variety of embodiments. As described above, each of the routers 62 are interconnected to each other and to the bridges 70 to form the programmable interconnect network 28. Each router may be individually configurable to provide the logical bonding. For example, each router may be programmed as either a master or a slave during a configuration of the integrated circuit 12 based on the number and pattern of logical bonding to be made from the physical paths 64.

During operation and after configuration, one or more of the AFUs 65 may transmit data into the programmable interconnect network 28 via the bridges 70 coupled to the transmitting AFU 65. The bridges 70 may operate to clock (e.g., transmit based on a clock signal defining the time of transmission) the data from the data packet into the programmable interconnect network 28. Upon receiving the packetized data, each router 62 analyzes the data, looks up an identifier associated with the data in a lookup table, and transmits the data to another router 62 or coupled bridge 70 circuitry based on the results from the lookup table inquiry.

In some cases, the bridges 70 are to transmit one or more data packets to an external circuit via the interconnect block 32. To do this, the bridges 70 transmit the data to the interconnect block 32. The interconnect block 32 may include circuitry to transmit the packetized data between the integrated circuit 12 and the external circuitry. The interconnect block 32 may assign the identifier to the data packet to be interpreted by the routers 62 at a future time during the lookup operation.

The depicted example of the programmable interconnect network 28 is a generalized example of the programmable interconnect network 28. In this way, the depicted programmable interconnect network 28 may be applied to a variety of network topologies. For example, the programmable interconnect network 28 may be applied to mesh topologies, cube topologies, hyper cube topologies, balanced and/or unbalanced tree topologies, ring topologies, split topologies, and so forth.

Figure 5B:
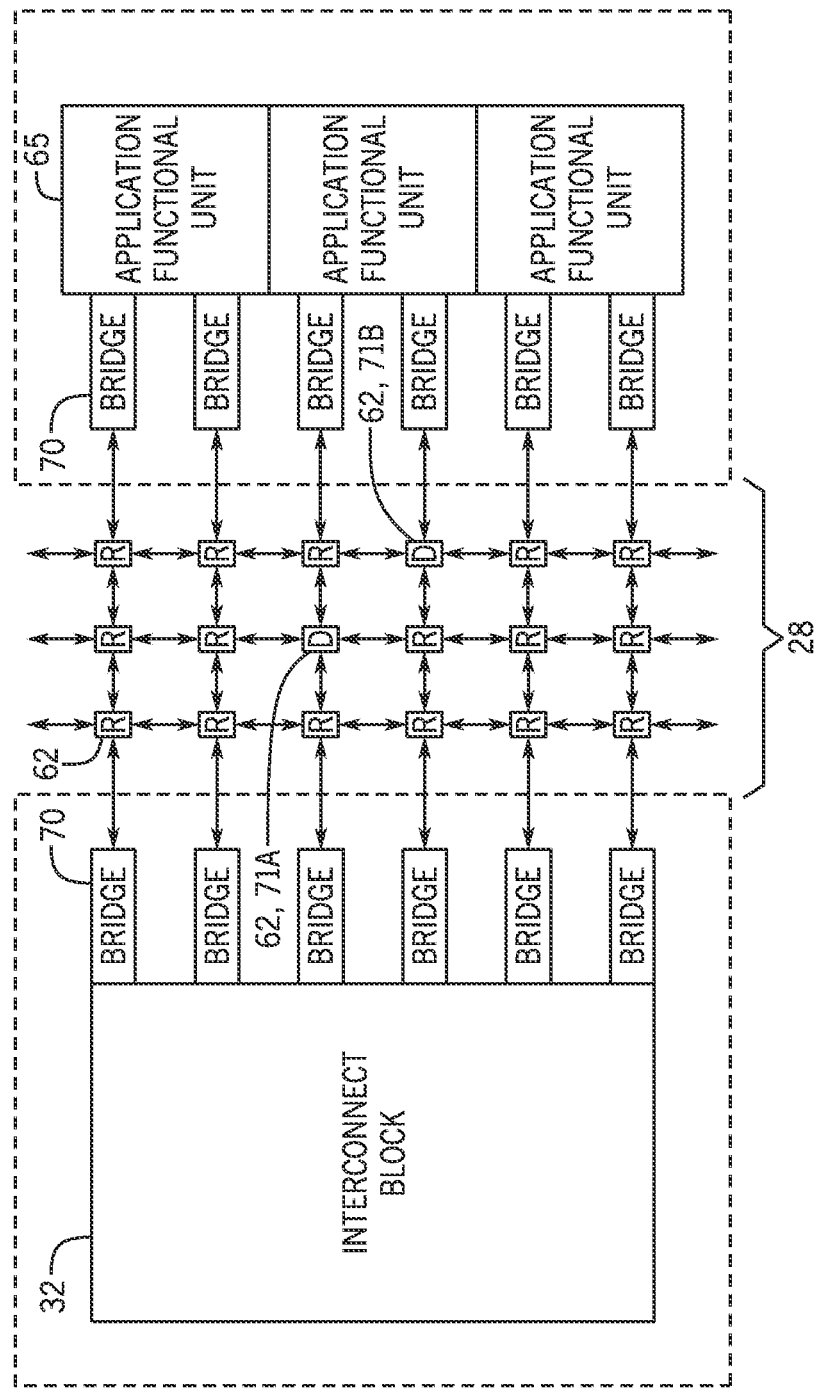
FIG. 5B is a block diagram of the programmable interconnect network of FIG. 5A taken at a first time and being used to transmit data packets through logically bonded data channels, in accordance with an embodiment.
Figure 5C:
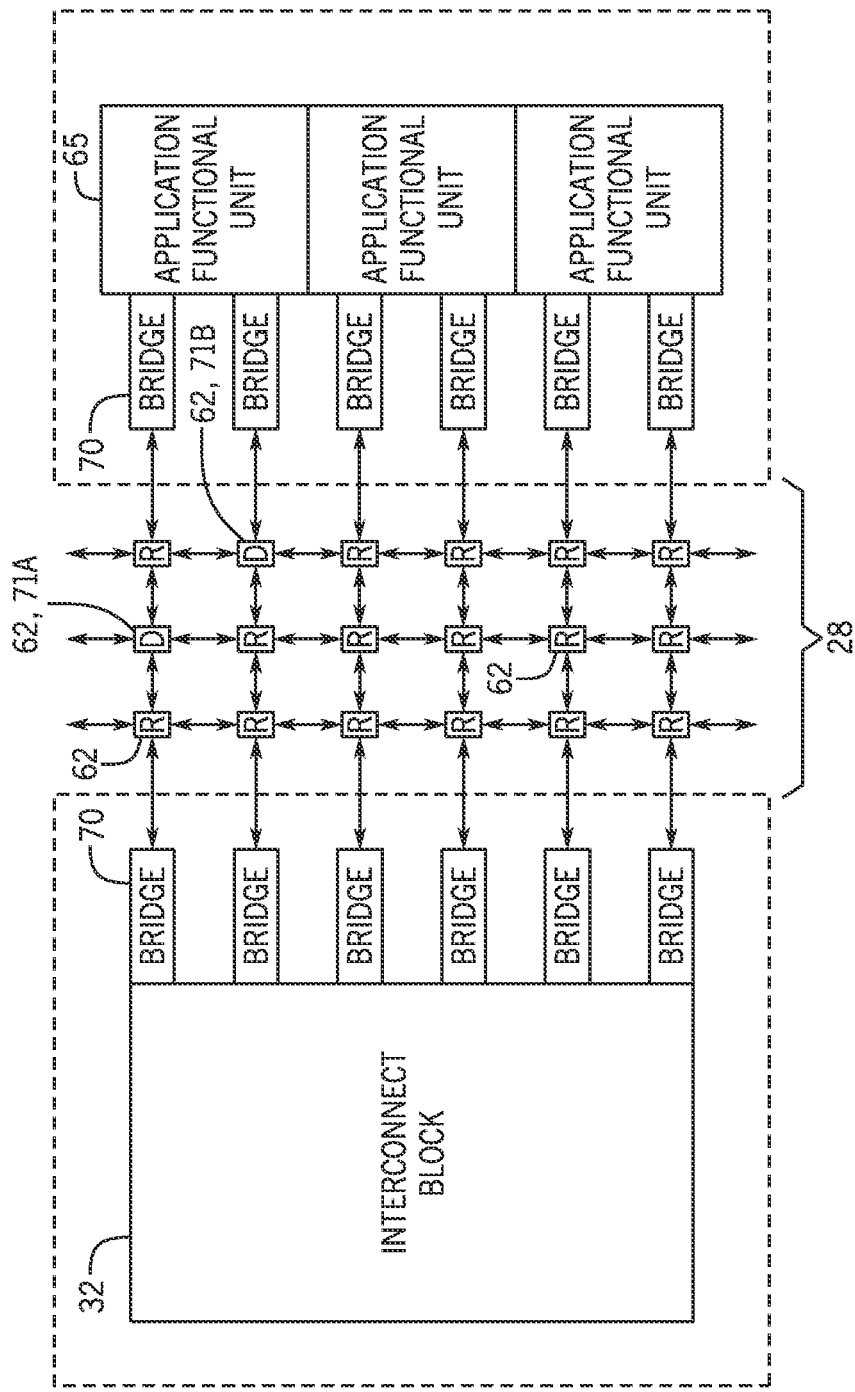
FIG. 5C is a block diagram of the programmable interconnect network of FIG. 5A taken at a second time and being used to transmit data packets through logically bonded data channels, in accordance with an embodiment.

To elaborate on operation of the programmable interconnect network 28, FIG. 5B is a block diagram of the example programmable interconnect network 28 of FIG. 5A performing a transmission operation at a first time and FIG. 5C is a block diagram of the example programmable interconnect network 28 of FIG. 5A performing a transmission operation at a second time. FIG. 5B and FIG. 5C are explained in conjunction with the FIG. 5A herein for ease of elaboration.

FIG. 5A, FIG. 5B, and FIG. 5C collectively depict a lockstep transmission operation. Data packet 71 is received in FIG. 5A at the interconnect block 32, divided into smaller data packets 71A and 71B for transmission through the programmable interconnect network 28. The data packet 71 may be divided based on the number of logically bonded physical paths 64 of the programmable interconnect network 28. The data packets 71A, 71B are transmitted to the programmable interconnect network 28 via the bridge 70.

From the bridge 70, the data packets 71A and 71B are transmitted in lockstep via the routers 62 to the target AFU 65. Lockstep transmission is a transmission scheme where latencies are compensated for through inherent delays introduced through the arrangements of the physical paths 64. For example, the data packet 71A is transmitted via a combination of routers 62 that, by the end of the transmission, equals a number of routers 62 associated with the transmission of the data packet 71B. Thus, a same number of clocking delay is added to the transmission of the data packet 71 before reaching the routers 62 coupled to the destination bridge 70.

Figure 6:
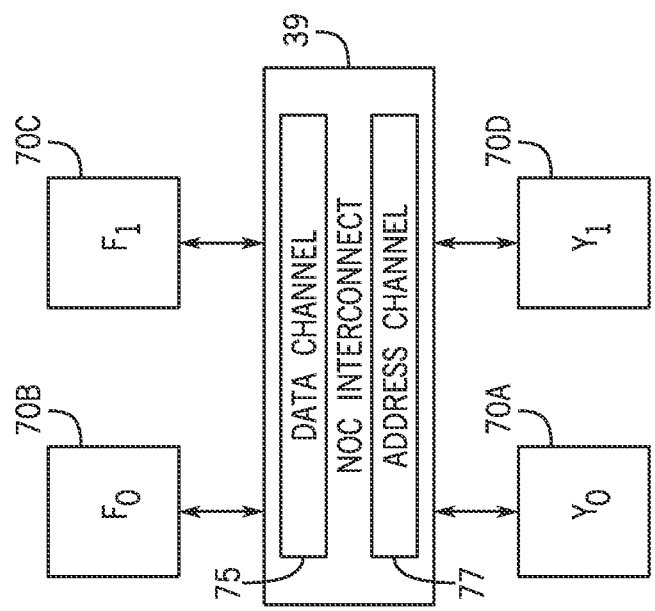
FIG. 6 is a block diagram of bridges associated with the programmable interconnect network of FIG. 5A, in accordance with an embodiment.

Keeping this in mind, FIG. 6 is a block diagram of the bridges 70 that are coupled to each other through the programmable interconnect network 28 (e.g., NOC interconnect). It should be understood that there may be additional components coupled between the bridges 70 and the programmable interconnect network 28. It should also be understood that many other topologies may also benefit from the disclosed techniques despite one particular interconnect topology being discussed herein.

A data packet to be transmitted may be processed by one or more of the bridges 70 and/or other processing circuitry before transmission of the data packet from a first location to a second location is completed. For example, a destination decoder may communicate with a router 62 via an identifier to communicate where the data packet is to be transmitted. The router 62 may use the identifier when referencing a look-up table to determine a target address, where the target address indicates at least in part a transmission direction associated with the data packet (e.g., a storage location, a slave the data packet is to be transmitted to, or any suitable transmission directional information). In this way, the router 62 may include configurable components, such as but not limited to configuration memory (e.g., CRAM), and memory storing at least the look-up table.

After determining the target destination (e.g., router 62 or bridge 70), the bridge 70 may transmit the data packet for transmission and routing to a different bridge 70. For example, a data packet from bridge 70A is transmitted through the programmable interconnect network 28 to the bridge 70B. As described above, this transmission is facilitated by the routers 62 transmitting data packets via the physical paths 64.

The physical paths 64 of the programmable interconnect network 28 may include a data channel 72 and an address channel 74. The bridges 70 may transmit a payload of the data packet separate from at least an address corresponding to the payload and stored in the data packet. The bridges 70 may transmit the address (e.g., synthesized and interpretable by the routers 62) via the address channel 74 and transmit the payload via the data channel 72.

Figure 7:
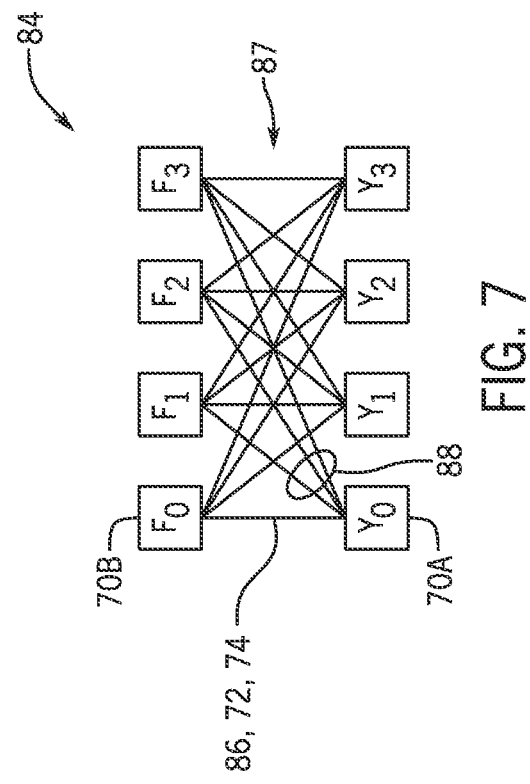
FIG. 7 is a schematic representation of an example programmable interconnect network of FIG. 3, in accordance with an embodiment.

Sometimes data transmission occurs between bridges 70. One way to couple multiple physical paths 64 together includes using multiple point-to-point interconnections such that each bridge 70 is coupled to each other bridge 70, as is shown in FIG. 7. FIG. 7 is a schematic representation 84 illustrating an example interconnect network 87. It should be understood that interconnections and data paths have been simplified for ease of discussion but that any suitable components may also be included along with the bridges 70 or between the programmable interconnect network 87.

In the depicted example, each of the bridges 70 may communicate and/or facilitate data packet transfer between each other. For example, bridge 70A may communicate with bridge 70B and/or bridge 70E, 70F, 70G. The bridges 70 may communicate (e.g., transmit data packets) through point-to-point hardwired data paths 88 (e.g., channels, physical paths). In this way, for each time a transaction occurs some data paths are left unused. For example, if bridge 70A is to transmit a data packet to the bridge 70B, the bridge 70A transmits the payload via a hardwired data path 86 that includes the data channel 72 and the address channel 74 described above. Therefore, losses and inefficiencies may be introduced into the integrated circuit, in addition to using a relatively large number of interconnects and physical routing, by using this example interconnect network 87.

Figure 8:
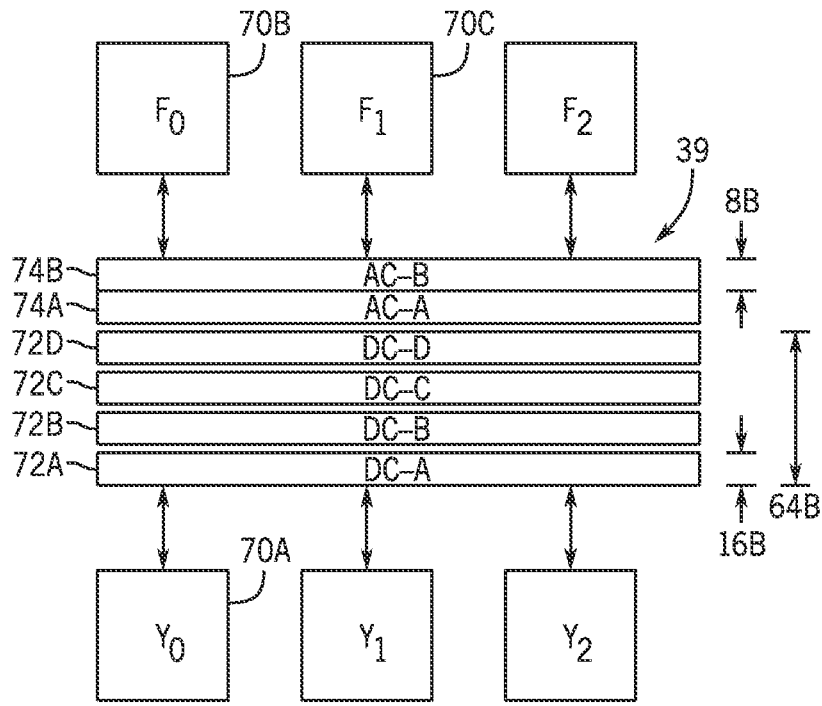
FIG. 8 is a schematic representation of another example programmable interconnect network of FIG. 3, in accordance with an embodiment.

In contrast to the interconnect network 87, an example of a programmable interconnect network 28 is depicted in FIG. 8. FIG. 8 is a schematic representation of an example programmable interconnect network 28. It should be understood that interconnections and data paths have been simplified for ease of discussion but that any suitable components may also be included along with the bridges 70 or between components of the programmable interconnect network 28, for example routers 62, decoders, or any other suitable circuitry and/or processing functions to facilitate with the routing and transmission of data packets. The programmable interconnect network 28 may include one or more data channels 72 (e.g., 72A, 72B, 72C, 72D) and one or more address channels 74 (e.g., 74A, 74B). Each of the data channels 72 may be respectively bonded together (e.g., logically bonded) in any suitable combination of sub-group. For example, the data channel 72A and the data channel 72B may be logically bonded together.

To highlight the benefits associated with the bonding technique, consider how a single data channel 72 may have a particular bandwidth. For example, the data channel 72A may have a bandwidth of 16 bytes (16B). It should be noted that any of the data paths (e.g., data channel 72 and/or address channel 74) may have any suitable size. When two data channels are bonded together, the total bandwidth may be additive. For example, if the data channel 72A were to be bonded with the data channel 72B, the total bandwidth may be 32 bytes (32B). In a similar way, if all four data channels 72 were bonded, the total bandwidth may be 64 bytes (64B). Thus, the respective data channels 72 may be selectively bonded to each other to transmit data packets of different bandwidths. In this way, the data channels 72 sufficient to transmit the data are enabled and used in transmitting the data.

Similarly, the address channels 74 may each have a particular bandwidth, such as 8 bytes (8B). The address channels 74 may also be selectively powered at a time of programming of the programmable logic fabric 30. Upon the compiler 22 or computing system 18 determining which channels 72, 74 to bond and which channels 72, 74 to leave unused, the unused channels 72, 74 may be power-gated (e.g., reduction of power supplied to the channel 72, 74) or may have power removed (e.g., disconnecting from a power supply of the integrated circuit 12). For example, if the data channel 72A were to be bonded to the data channel 72B and the data channel 72C and the data channel 72D were left unused, the data channel 72D may be power-gated (e.g., reduced, reduced to zero in a power removal). Through power-gating or removing power supplied to the unused channels of the channels 72, 74, power consumed by the programmable interconnect network 28 may be reduced, therefore also reducing power consumed by the integrated circuit 12. Thus, benefits of using the techniques described herein not only include improved utilization of the programmable interconnect network 28 but also include reducing power consumed by the programmable interconnect network 28.

Bonding may be permitted using any suitable logical (e.g., logic-based) bonding technique. For example, one or more respective data channels 72 may be bonded by using master-slave techniques, or any suitable technique or combination of techniques. The master-slave technique uses lockstep operation to logically bond respective data channels 72. The lockstep operation permits the logically bonded data channels 72 to transmit portions of the same data packet in parallel with each other but offset in position (as described above with reference to FIG. 5A, FIG. 5B, and FIG. 5C). The master-slave technique may use one or more well-defined states (e.g., associated with state machines) to generate a predictable output in response to a particular input to the particular data channel 72. More particularly, one or more routers 62 associated with the bonded data channels 72 may operate in lockstep with each other, such that the one or more routers 62 may output (e.g., respond) the same to the same input. When the data channels are logically bonded together, a same particular input to one or more logically bonded routers 62 may generate a same predictable output, such that each bonded data channel acts in lockstep to complete (e.g., fulfil) a transmission. In this way, a master router 62 may receive an input, generate the output, and instruct one or more slave routers 62 to output the same output (e.g., where the data channel 72 receiving the instruction is the slave data channel 72) but offset in position to permit lockstep operation over time. Thus, the master router 62 transmits equivalently to the slave routers 62, therefore enabling logical bonding to occur.

Figure 9A:
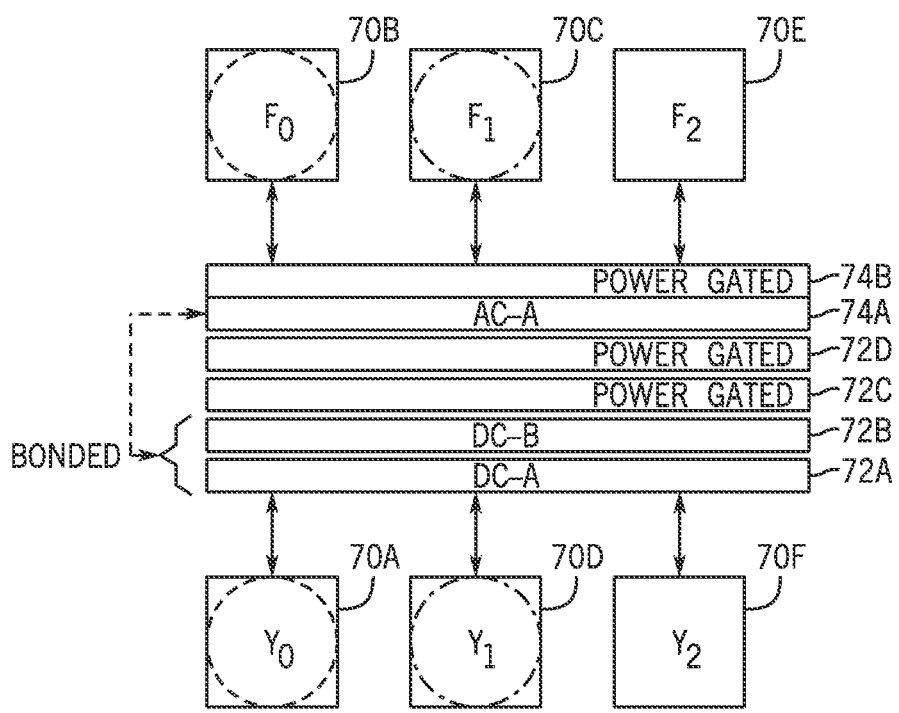
FIG. 9A is a schematic representation of a sample configuration of the programmable interconnect network of FIG. 8, in accordance with an embodiment.
Figure 9B:
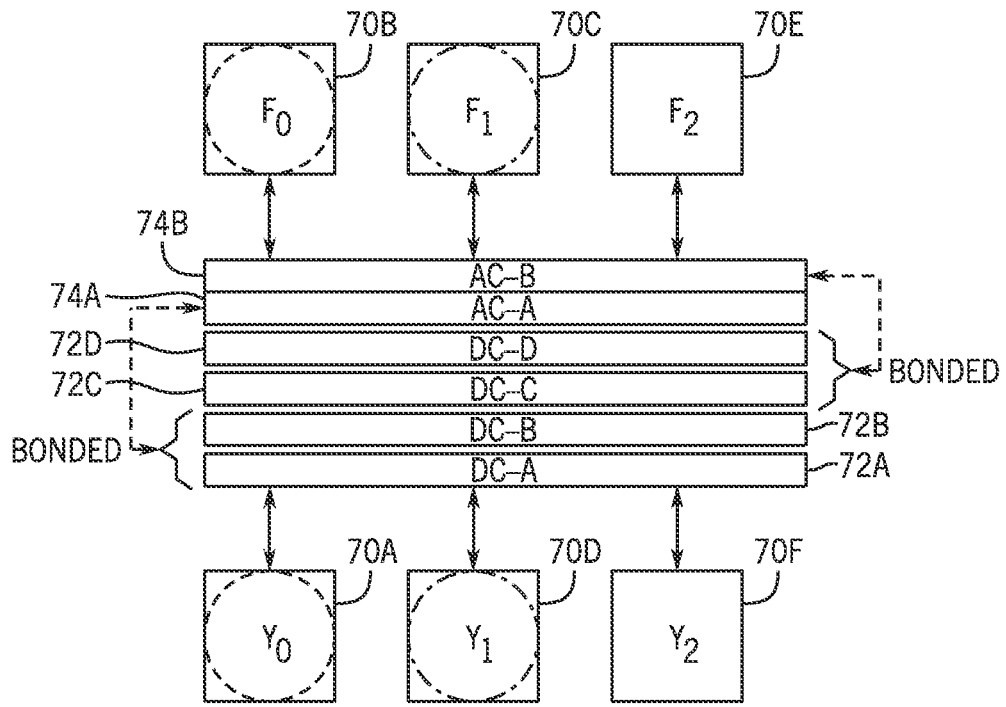
FIG. 9B is a schematic representation of a sample configuration of the programmable interconnect network of FIG. 8, in accordance with an embodiment.

Keeping the foregoing in mind, FIG. 9A is a schematic representation illustrating a sample configuration of the programmable interconnect network 28. FIG. 9B is a schematic representation illustrating an embodiment of the sample configuration of FIG. 9A. It is noted that either sample configuration depicted in FIG. 9A or FIG. 9B may be a valid configuration to apply to the programmable interconnect network 28 at a time of programmable logic fabric 30 configuration to meet transmission parameters of the transactions to be performed. For ease of comparison, FIG. 9A and FIG. 9B are described below together.

In this use-case example, a first transaction of size 32 bytes is to be sent from bridge 70B to bridge 70A and a second transaction of size 32 bytes is to be sent mutually exclusive of the first transaction from bridge 70C to bridge 70D. In both transactions, bandwidth utilization is prioritized but power consumption is still also considered. The compiler 22 and/or computing system 18 may determine these transmission parameters at a time of design analysis for the programmable logic fabric 30 configuration.

FIG. 9A depicts a first solution option where a first logical channel is provided by bonding the data channel 72A with the data channel 72B (e.g., total of 32 bytes). The compiler 22 and/or the computing system 18 may determine to power-gate or power-off the remaining data channels, that is, data channel 72C and data channel 72D. The address channel 74A may be used to transmit the address associated with the transaction and the address channel 74B may be power-gated or, in some cases, powered-off. The transaction between the bridge 70C and the bridge 70D may use the same bonded data channels 72A, 72B and the same address channel 74A (e.g., as depicted in FIG. 9A). Or, the transaction between the bridge 70C and the bridge 70D may use differently bonded data channels.

FIG. 9B depicts a second solution option where a first logical channel is provided by bonding the data channel 72A with the data channel 72B (e.g., 32 bytes), and a second logical channel (e.g., 32 bytes) is provided by bonding the data channel 72C with the data channel 72C. Since separate data channels 72 are bonded into separate sub-groups, both the address channels 72 are to be used during transmission, thus neither the address channel 72A nor the address channel 74B may be power-gated. It is noted that in this example, none of the depicted data channels 72 are power-gated or powered-off since each are used.

Figure 10:
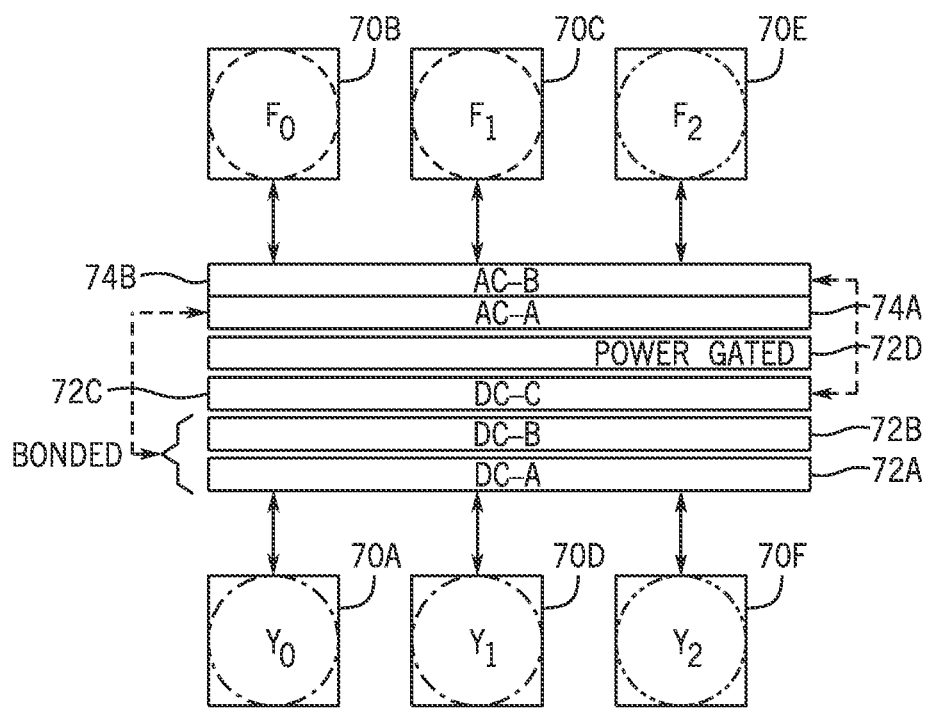
FIG. 10 is a schematic representation of a sample configuration of the programmable interconnect network of FIG. 8, in accordance with an embodiment.

To explain another use case example, FIG. 10 is a schematic representation illustrating a sample configuration of the programmable interconnect network 28. In this use-case example, a first transaction of size 32 bytes is to be sent from the bridge 70B to the bridge 70C, a second transaction of size 16 bytes is to be sent from the bridge 70A to the bridge 70C, and a third transaction of size 16 bytes is to be sent from the bridge 70E to the bridge 70F. In the first transition, bandwidth utilization and latency concerns are prioritized while in the second and third transactions, the latency concerns are prioritized over the bandwidth utilization. The compiler 22 and/or the computing system 18 may determine these transmission parameters at the time of analysis of the data packets to be transmitted.

The depicted solution includes one 32 byte logical channel and one 16 byte logical channels for the three transactions. The first transaction uses the 32 byte logical channel provided by bonding the data channel 72A with the data channel 72B. The first transaction uses the address channel 74A. The second transaction and the third transaction share the data channel 72C. Since both transactions (e.g., second transaction and third transaction) may occur without interrupting any transaction paths, the same address channel 74B and same data channel 72C may be used. The data channel 72D may be unused, and thus may be power-gated or, in some cases, powered-off.

Figure 11:
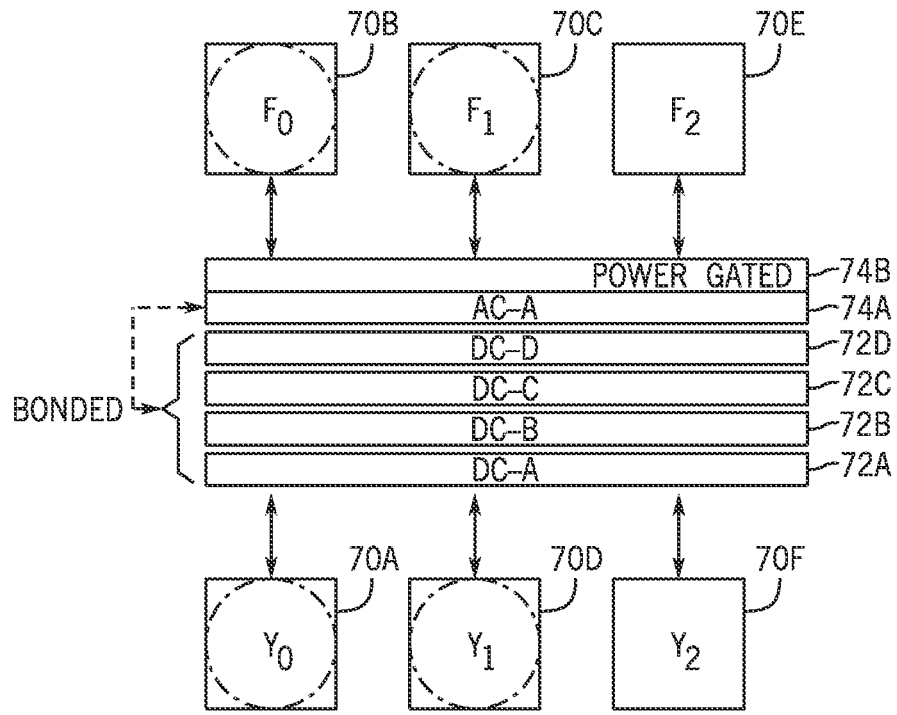
FIG. 11 is a schematic representation of a sample configuration of the programmable interconnect network of FIG. 8, in accordance with an embodiment.

To explain yet another use case example, FIG. 11 is a schematic representation illustrating another sample configuration of the programmable interconnect network 28. In this use-case example, a transaction of size 64 bytes is to be sent from bridge 70B to bridge 70C, bridge 70A, and bridge 70D. For this transition, bandwidth utilization is prioritized. The compiler 22 and/or the computing system 18 may determine these transmission parameters at the time of analysis of the data packets to be transmitted.

The depicted solution includes one 64 byte logical channel the transaction. The transaction uses the 64 byte logical channel provided by bonding the data channel 72A with the data channel 72B, the data channel 72C, and the data channel 72D. This transaction is depicted as using the address channel 74A. The address channel 74B may be unused, and thus may be power-gated or, in some cases, powered-off. It is noted that in this example, none of the depicted data channels 72 are power-gated or powered-off since each are used.

Figure 12:
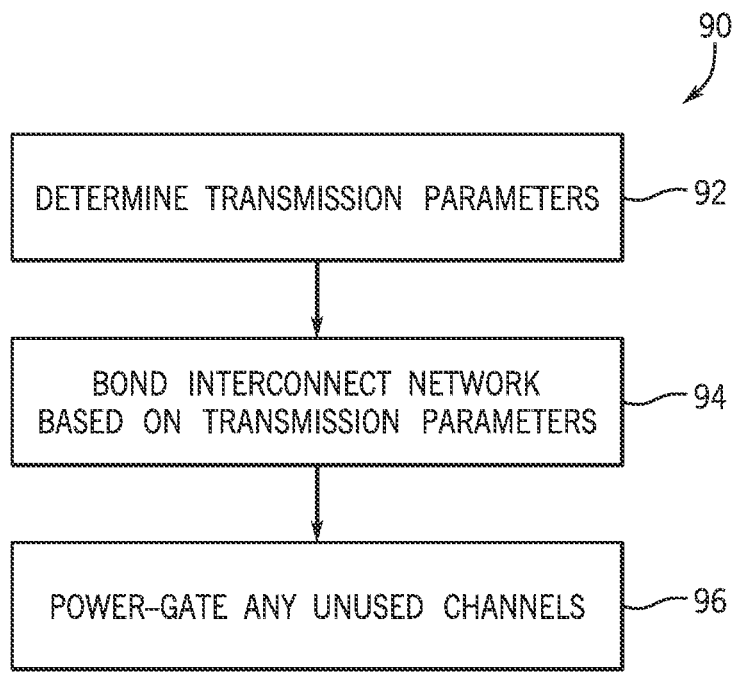
FIG. 12 is a method for determining a configuration of the programmable interconnect network of FIG. 8, in accordance with an embodiment.

To help explain the process of configuring the programmable interconnect network 28, as described above, FIG. 12 is a method 90 for determining a configuration of the programmable interconnect network 28. Generally the method 90 includes determining transmission parameters (block 92), bonding the programmable interconnect network 28 based at least in part on the transmission parameters (block 94), and power-gating any unused channels (block 96). In some embodiments, the method 90 may be implemented at least in part by executing instructions stored in a tangible, non-transitory, computer-readable medium, such as the memory 42, using processing circuitry, such as the compiler 22 and/or the computing system 18.

Thus, in some embodiments, compiler 22 and/or the computing system 18 may determine transmission parameters associated with a current configuration to be processed and loaded into the integrated circuit 12 associated with the programmable interconnect network 28 (e.g., programmable logic fabric 30) (block 92). As defined above, transmission parameters include any setting or configuration option that is taken into account when determining how to route a data packet through the programmable interconnect network 28 and to which bridges 70 to route the data packets to. In this way, transmission parameters include a direction of transmission, an indication of destination bridge 70 or destination location, power and/or latency considerations, transmission bandwidth associated with the data to be transmitted, or the like. In some embodiments, transmission parameters also include a prioritization indication that indicates which of the transmission parameters is the priority (e.g., a fulfilment priority) when finalizing the configuration of the programmable interconnect network 28. The transmission parameters may be determined by one or more of the bridges 70 or by any other suitable processing circuitry associated with the integrated circuit 12.

After determining the transmission parameters, the compiler 22 and/or the computing system 18 may bond the programmable interconnect network 28 based at least in part on the transmission parameters (block 94). The programmable interconnect network 28 is a dynamically configurable connection network that is selectively bonded and used on a per-use basis (e.g., per device-configuration basis). In this way, the programmable interconnect network 28 may be adjusted to account for changes in the transmission parameters of different device configurations. The transmission parameters may be re-determined and used to re-bond the programmable interconnect network 28 in response to a re-configuration of the programmable logic fabric 30 or a partial reconfiguration of the programmable logic fabric 30, or in response to any suitable change in the integrated circuit 12. In the specific use-case of an FPGA or programmable logic device, partial reconfiguration of the programmable logic fabric 30 may occur when a portion of the programmable logic fabric 30 is updated with a configuration file to perform a modified function. As such, transmission parameters associated with the portion of the programmable logic fabric 30 may also change with the partial reconfiguration. Thus, the changed transmission parameters may be used to reprogram the programmable interconnect network 28.

For example, bonding based on the transmission parameters may include analyzing a data bandwidth for one or more potential transactions and determining which data channels 72 are available for bonding or assignment to additively create the data bandwidth for the transaction corresponding to the highest bandwidth usage. It is noted that bonding is inclusive of deciding to not bond or self-bond, resulting in a data channel bonding of 1 (e.g., referring to FIG. 10, the data channel 72C for an example of a self-bonded data channel 72). Furthermore, based on the priority of each transmission parameter, the bonding may change. Take, for example, the programmable interconnect network 28 depicted in FIG. 10. In this example, the first transaction prioritized bandwidth while the second and third transactions put less of a priority on bandwidth. The bonding decision was affected by this and thus the first transaction was assigned data channels 72A, 72B and address channel 74A while the second and third transactions were assigned to share the data channel 72C.

Continuing on with the method 90, once the particular channels 72, 74 are bonded based on the transmission parameters, the compiler 22 and/or the computing system 18 may configure the integrated circuit 12 to power-gate any unused channels 72, 74 (block 96). Power-gating may occur simultaneously (or may start simultaneously) to the completion of the transaction (e.g., to the sending of the data via the programmable interconnect network 28). It should be noted that power-gating refers to reducing power supplied to any of the unused channels 72, 74. Power may be gated to zero, at which point the unused channels 72, 74 may be considered powered-off. The compiler 22 and/or the computing system 18 may program the integrated circuit 12 to initiate the power-gating or powering-off to occur, such as via activation of one or more control signals to operate circuitry, such as switching circuitry, to cause the power adjustments. The one or more control signals may be initiated substantially similar to a start time of a data transmission associated with completing the transaction request. Since unused channels 72, 74 are able to be power-gated or powered-off, utilization and power consumption may be based on actual use of the programmable interconnect network 28 instead of based on an overall size if the programmable interconnect network 28 (e.g., since more channels may consume more power when none are being power-gated).

By using the above-described techniques and examples, a programmable interconnect network that has a dynamic configurability may be provided. The programmable interconnect network may permit application-specific configuration and/or use-case specific programming of the programmable interconnect network. Other benefits include realizing FPGA and/or integrated circuit system power savings through power-gating or powering-off unused channels and realizing footprint improvements since a dynamic programmable interconnect network may reside in a smaller footprint than other programmable interconnect networks that use multiple point-to-point channels (e.g., as depicted in FIG. 7). Furthermore, these techniques described herein permit tailoring the bonding and programmable interconnect network configurations on a per-use basis based on transmission parameters that define bandwidth and/or latency considerations for the transaction.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A multi-die system, comprising:
   a processing circuit disposed on a first die; and
   a network-on-chip disposed at least in part on the first die, wherein the network-on-chip is configurable to facilitate memory transactions between the first die and a second die, wherein the network-on-chip comprises a plurality of data lanes, wherein the network-on-chip is configurable to transmit data between the first die and the second die via a bus formed from the plurality of data lanes, and wherein the network-on-chip is configurable to reduce power consumed at least in part by reducing a width of the bus based on traffic latency and bandwidth.

2. The multi-die system of claim 1, wherein the network-on-chip is configurable to couple to memory disposed external to the network-on-chip.

3. The multi-die system of claim 1, wherein reducing the width of the bus comprises reducing the width of the bus from 16 lanes to 8 lanes.

4. The multi-die system of claim 1, wherein the network-on-chip comprises a first set of data lanes of the plurality of data lanes and a second set of data lanes of the plurality of data lanes.

5. The multi-die system of claim 4, wherein the network-on-chip is configurable to reduce the width of the bus by using the first set of data lanes to transmit the data while the second set of data lanes is not used.

6. A method, comprising:
operating a programmable interconnect network at a first data width, wherein the programmable interconnect network is configurable to span multiple die of a same package;
determining, based on memory latency, to reduce a power state of the programmable interconnect network; and
reducing the power state of the programmable interconnect network at least in part by operating the programmable interconnect network at a second data width less than the first data width.

7. The method of claim 6, wherein operating the programmable interconnect network at the first data width comprises operating a plurality of data lanes of the programmable interconnect network to transmit data having the first data width.

8. The method of claim 6, comprising determining to control the power state of the programmable interconnect network based on usage of the programmable interconnect network based on a setting.

9. The method of claim 6, wherein the first data width comprises 16 lanes, and wherein the second data width comprises 8 lanes.

10. The method of claim 6, wherein the second data width is half that of the first data width.

11. The method of claim 6, comprising transmitting, via the programmable interconnect network, a memory transaction between a first die and a second die.

12. An integrated circuit, comprising:
a first set of lanes of a plurality of lanes corresponding to a network-on-chip; and
a second set of lanes of the plurality of lanes corresponding to the network-on-chip, wherein the second set of lanes and the first set of lanes are configurable to facilitate memory transactions between a first die and a second die, and wherein using the first set of lanes to transmit data while the second set of lanes is inactive is based on memory latency and reduces power consumed by the network-on-chip.

13. The integrated circuit of claim 12, wherein the network-on-chip is configurable to reduce the power consumed based on usage of the network-on-chip.

14. The integrated circuit of claim 13, wherein the first die corresponds to an external system.

15. The integrated circuit of claim 12, wherein the first set of lanes comprises 8 lanes, and wherein the second set of lanes comprises 8 lanes.

16. The integrated circuit of claim 12, wherein the first set of lanes and the second set of lanes are both used to transmit the data in response to traffic of the network-on-chip.

* * * * *